United States Patent
Manger et al.

(10) Patent No.: US 7,678,679 B2
(45) Date of Patent: Mar. 16, 2010

(54) VERTICAL DEVICE WITH SIDEWALL SPACER, METHODS OF FORMING SIDEWALL SPACERS AND FIELD EFFECT TRANSISTORS, AND PATTERNING METHOD

(75) Inventors: Dirk Manger, Dresden (DE); Jyoti Gupta, Dresden (DE); Christoph Ludwig, Langebrück (DE); Hans Lindemann, Dresden (DE)

(73) Assignee: Qimonda AG, Munich (DE)

( * ) Notice: Subject to any disclaimer, the term of this patent is extended or adjusted under 35 U.S.C. 154(b) by 582 days.

(21) Appl. No.: 11/414,553

(22) Filed: May 1, 2006

(65) Prior Publication Data

US 2007/0254442 A1  Nov. 1, 2007

(51) Int. Cl.
 *H01L 21/3205* (2006.01)
 *H01L 21/4763* (2006.01)
(52) U.S. Cl. ........................ 438/595; 438/265; 438/230; 438/303; 257/E21.626; 257/E21.64
(58) Field of Classification Search ................. 438/211, 438/218, 445, 446, 595, 230, 265, 303, 366, 438/FOR. 182, FOR. 192, FOR. 199; 257/E21.626, 257/E21.64
See application file for complete search history.

(56) References Cited

U.S. PATENT DOCUMENTS

| 4,597,824 | A | * | 7/1986 | Shinada et al. ............... 438/305 |
| 5,202,287 | A | * | 4/1993 | Joshi et al. ................... 438/653 |
| 5,396,456 | A | * | 3/1995 | Liu et al. ...................... 365/174 |
| 5,817,562 | A | * | 10/1998 | Chang et al. ................. 438/305 |
| 6,319,782 | B1 | * | 11/2001 | Nakabayashi ............... 438/300 |
| 6,483,158 | B1 | * | 11/2002 | Lee ............................. 257/408 |
| 6,495,430 | B1 | * | 12/2002 | Tsai et al. .................... 438/424 |
| 6,806,149 | B2 | * | 10/2004 | Bu et al. ...................... 438/299 |
| 2003/0127695 | A1 | * | 7/2003 | Ozawa et al. ................ 257/382 |

FOREIGN PATENT DOCUMENTS

| EP | 1403915 A2 | | 3/2004 |
| JP | 01-208865 | * | 8/1989 |

* cited by examiner

*Primary Examiner*—Matthew Smith
*Assistant Examiner*—Quovaunda Jefferson
(74) *Attorney, Agent, or Firm*—Edell, Shapiro & Finnan, LLC

(57) ABSTRACT

A growth material that grows selectively on the vertical sidewalls of a vertical device forms sidewall spacers on substantially vertical sidewalls of the vertical device that is disposed on a horizontal substrate surface of a semiconductor substrate. A spacer-like seed liner may be provided on the vertical sidewalls of the vertical device to control selective growth. The vertical device may be a gate electrode of a field effect transistor (FET). With selectively grown sidewall spacers, heavily doped contact regions of the FET may be precisely spaced apart from the gate electrode. The distance of the heavily doped contact regions to the gate electrode does not depend from the height of the gate electrode. Distances of more than 150 nm between the heavily doped contact region and the gate electrode may be achieved so as to facilitate the formation of, for example, DMOS devices.

12 Claims, 9 Drawing Sheets

VERTICAL DEVICE WITH SIDEWALL SPACER, METHODS OF FORMING SIDEWALL SPACERS AND FIELD EFFECT TRANSISTORS, AND PATTERNING METHOD

TECHNICAL FIELD

The present invention relates to a semiconductor substrate having a vertical device with sidewall spacer. The invention relates further to a method of forming the vertical device with sidewall spacer on the semiconductor substrate, to a method of forming a field effect transistor making use of the method of forming the vertical device with sidewall spacer on the semiconductor substrate and further to a patterning method.

BACKGROUND

An active area of a field-effect transistor (FET) is formed in a single crystalline semiconductor substrate such as a silicon wafer. The active area includes two doped impurity regions defining a first and a second source/drain region of the field-effect transistor and a channel region between the first and the second source/drain region. The first and the second source/drain region have a first conductivity type. The channel region is not doped or is of a second conductivity type, which is the opposite of the first conductivity type. The source/drain regions and the channel region adjoin a substrate surface of the semiconductor substrate.

A gate electrode is disposed on the substrate surface above the channel region. A gate dielectric insulates the gate electrode from the channel region. An electric potential applied to the gate electrode controls by capacitive coupling a charge carrier distribution in the adjoining channel section.

Lightly doped sections of the source/drain regions are aligned to the opposing vertical sidewalls of the gate electrode. Heavily doped sections of the source/drain regions provide low resistivity contact regions for to connect the respective source/drain region to another electrical circuit that is provided in or above the semiconductor substrate. For proper operation of the FET, especially of a FET realized for DMOS applications, the heavily doped sections of the source/drain regions must be formed in a defined distance to the opposing vertical sidewalls of the gate electrode.

Sidewall spacers are commonly used to define an implant mask for the definition of the heavily doped sections of the source/drain regions. Further, sidewall spacers are used to insulate the gate electrode of a FET from contact structures accessing the source/drain regions.

Spacer structures like sidewall spacers are used in a multitude of patterning methods that provide secondary structures in a defined distance to primary structures wherein the distance between the two structures cannot be controlled sufficiently by lithographic patterning methods due to their sub-lithographic footprint and the existing topography.

In connection with the formation of field effect transistors a sidewall spacer is commonly a small strip of silicon nitride or silicon dioxide, which extends on opposing sides of the polysilicon gate electrode. The sidewall spacer acts as an implant mask and shields the underlying lightly doped sections of the source/drain regions from the subsequent heavy implant dose for providing the heavily doped contact sections of the source/drain regions.

The sidewall spacer is usually formed from a conformal layer of deposited oxide or nitride or a combination of these. An anisotropic etch is performed, wherein horizontal sections of the conformal layer are removed. The anisotropic etch is or comprises a sputter etch and removes the deposited material in a top-bottom direction. The etch process is stopped after removal of the horizontal sections of the conformal layer, such that residues of the conformal layer form sidewall spacers on the vertical sidewalls.

Sidewall spacer control deteriorates with increasing thickness of the sidewall spacer with reference to the height of the gate electrode. The yield of a sputter etch process depends on the inclination of the etched surface to the sputter beam. Regarding the sputter etch processes used in connection with the formation of sidewall spacers, the yield is high for an inclination of the etched surface of about 30 to 40 degrees towards the sputter beam. Starting from a rectangular structure with a horizontal surface and a vertical surface forming a right-angled edge, an etch process with a sputter etch component therefore tends to generate an oblique surface having an inclination of about 30 to 40 degrees to the sputter beam with continuing process time. With increasing thickness of the conformal layer with respect to the height of the gate electrode, an anisotropic etch process therefore results more in a triangular cross-section of the sidewall spacer than in a rectangular cross-section, wherein an incline angle between the outer vertical sidewall of the sidewall spacer and the substrate surface is about 50 to 60 degrees.

As a consequence, the width of the sidewall spacer on the base near the substrate surface depends on the height of the gate electrode. For voltage differences between the gate electrode and the heavily doped section of the source/drain regions of above 10 V a distance between the heavily doped source/drain region and the gate electrode of about 180 to 220 nm is required. For typical heights of the gate electrode stack of 200 nm the usual spacer technology does not reliably meet the requirements on spacer conformity.

Additionally, at the edge of the sidewall spacer the underlying etch stop liner suffers from defect issues due to the requirement of an over-etch of the conformal layer in order to ensure complete removal from horizontal sections.

The spacer width is governed therefore by the profile of the gate electrode, the thickness control, and the conformity of the spacer dielectric deposition as well as the ratio of an isotropic component to the anisotropic component of the spacer etch. Improved control of all factors that can affect the spacer width, such as spacer dielectric deposition and etch end-point detection, will be needed to ensure sufficient reproducibility.

Therefore a need exists for sidewall spacers and for methods of forming such sidewall spacers, which are independent from process deviations. Providing such spacer structures and providing such methods for forming such sidewall spacers make feasible new advantageous methods of forming field effect transistors and new advantageous patterning methods.

SUMMARY

In one embodiment, the present invention provides a semiconductor substrate with a vertical device with sidewall spacers. The semiconductor substrate comprises a non-growth section consisting of a passive material. The passive material is selected such that it is essentially inert to a gaseous precursor.

The vertical device is disposed on a substrate surface of the semiconductor substrate and includes at least one essentially or substantially vertical sidewall with an upper edge with respect to the substrate surface. The vertical device includes at least one seed section. The seed section includes a seed material and adjoins the at least one vertical sidewall. The seed material facilitates deposition of a growth material resulting from the gaseous precursor.

The sidewall spacer elongates along the at least one vertical sidewall of the vertical device. The sidewall spacer consists of the growth material that is formed from the gaseous precursor on the seed section, such that the grown sidewall spacer shows essential uniform thickness in each horizontal cross-section. Thus, according to the invention, the sidewall spacer results from a selective growth on the vertical sidewall of the vertical device. Contrary to sidewall spacers emerging from conventional methods, the thickness of the sidewall spacer is essentially uniform, even if the thickness is in the range of the height of the vertical device. The profile does not depend from any preceding etch process or the conformity of a preceding deposition process. Additionally, the outer vertical sidewall of the sidewall spacer according to the invention is essentially vertical. The width of the sidewall spacer in a base section adjacent the substrate surface is independent from the height of the vertical device.

In another embodiment, the present invention provides a method of forming a vertical device with a sidewall spacer on a semiconductor surface. A semiconductor substrate is provided that comprises a non-growth section adjoining a substrate surface of the semiconductor substrate. The non-growth section consists of a passive material, wherein the passive material is essentially inert to the gaseous precursor.

The vertical device is disposed on the substrate surface. The vertical device includes at least one essentially vertical sidewall with an upper edge with respect to the substrate surface. The vertical sidewall adjoins the non-growth section of the semiconductor substrate. The vertical device further includes at least one seed section, wherein the seed section consists of a seed material and adjoins the at least one vertical sidewall. The seed material facilitates deposition of a growth material resulting from the gaseous precursor.

The sidewall spacer is provided. The sidewall spacer elongates along the at least one vertical sidewall. The sidewall spacer consists of the growth material, wherein the growth material is constituted from the gaseous precursor being adsorbed and/or decomposed on the seed section, such that the grown sidewall spacer shows essentially uniform thickness in each horizontal cross-section.

The inventive method of forming vertical devices with sidewall spacers makes feasible the formation of sidewall spacers with nearly or substantially vertical outer sidewalls. The width of the sidewall spacer in a base section adjacent the semiconductor substrate does not depend from the conformity of preceding deposition processes or from redeposition processes during an anisotropic etch. As a further advantage, the width of the sidewall spacer does not depend from the height of the vertical device.

Further, the inventive method of forming a vertical device with sidewall spacers makes feasible the formation of sidewall spacers having a width of about 200 nm at a height of the vertical device of 200 nm with high reliability.

In a further embodiment of the invention, the inventive method of forming a vertical device with sidewall spacers is part of an inventive method of forming a field effect transistor.

For forming the field effect transistor, a semiconductor substrate is provided. A dielectric liner is formed on a substrate surface of the semiconductor substrate, wherein a first section of the dielectric liner forms a gate dielectric of the field effect transistor. Further, a second section of the dielectric liner forms a non-growth section in terms of the inventive method of forming a vertical device with sidewall spacers as discussed above.

A gate electrode is provided on the dielectric liner. The gate electrode is disposed on the substrate surface of the semiconductor substrate and includes two essentially or substantially vertical sidewalls on opposing sides. The gate electrode has an upper edge with respect to the substrate surface. The gate electrode forms an inner section of a vertical device in terms of the inventive method of forming a vertical device with sidewall spacers as discussed above.

Lightly doped source/drain regions are formed within the semiconductor substrate through implants, wherein the gate electrode serves as a first implant mask. The implanted lightly doped source/drain regions are formed on the opposing sides of the gate electrode.

A seed liner is provided on the two vertical sidewalls of the inner section. The seed liner consists of a seed material, wherein the seed material forms a preferential site for a deposition of a growth material resulting from the gaseous precursor.

Sidewall spacers are provided according to the above-discussed inventive method of forming a vertical device with sidewall spacers. The sidewall spacers elongate along the opposing vertical sidewalls and may reach from the substrate surface to the upper edge of the vertical sidewall respectively. The sidewall spacers consist of the growth material being formed by adsorption and/or decomposition of the gaseous precursor on the seed liner, such that the grown sidewall spacer shows essentially uniform thickness in each horizontal cross-section.

Heavily doped contact regions are formed within the semiconductor substrate through implants, wherein the gate electrode and the sidewall spacers act as a second implant mask. The implanted heavily doped contact regions confine to the spacer structures on opposing sides of the gate electrode.

In this way, the inventive method of forming a vertical device with sidewall spacers is incorporated in a method of forming a field effect transistor. As the implantation of the heavily doped contact regions is performed on the base of sidewall spacers that are grown conformally on the vertical sidewalls of the gate electrode, the edges of the heavily doped implant regions are well defined. The distances between the edges of the heavily doped implant regions and the gate electrode are independent from the conformity of a deposition process and from an isotropic component of a predominantly anisotropic etch process. Especially, the distance between the heavily doped contact region and the gate electrode is independent from the height of the gate electrode.

In a further embodiment, the present invention provides a method of aligning a secondary device to a primary vertical device that incorporates the inventive method of providing a vertical device with a sidewall spacer on a semiconductor substrate.

According to the inventive method of aligning a secondary device to a vertical device, a semiconductor substrate is provided comprising a non-growth section. The non-growth section consists of a passive material being essentially inert to a gaseous precursor. A vertical device is disposed on the substrate surface of the semiconductor substrate. The vertical device includes at least one essentially or substantially vertical sidewall with an upper edge with respect to the substrate surface. The at least one essentially or substantially vertical sidewall adjoins to the non-growth section of the semiconductor substrate. The vertical device has at least one seed section consisting of a seed material and adjoining the at least one vertical sidewall. The seed material is selected such that it facilitates the deposition of a growth material resulting from the gaseous precursor by forming a preferential site for adsorbing and/or decomposing the gaseous precursor.

A sidewall spacer is provided. The sidewall spacer elongates along the at least one vertical sidewall. The sidewall spacer consists of the growth material being formed by adsorption and/or decomposition of the gaseous precursor on the seed section, such that the grown sidewall spacer shows essentially or substantially uniform thickness in each horizontal cross-section.

Then the secondary device is disposed adjacent the sidewall spacer.

According to one embodiment, the secondary device is a further vertical device being formed by deposition of a deposition material on the substrate surface and the sidewall spacer.

According to a further embodiment, the secondary device comprises a doped region within a semiconductor substrate. The doped region is formed by implantation of a doping material into an implant section of the semiconductor substrate. Thereby the sidewall spacer acts as an implant mask.

According to another embodiment, the second structure comprises a buried device. Etching a trench into the semiconductor substrate forms the buried device. The trench is aligned to the outer edge of the sidewall spacer.

In each case, the secondary device is spaced apart from the vertical device in a well-controlled distance. The distance is independent from the height of the vertical device. Deviations of the distance are independent from deviations in conformity of a deposited layer and an isotropic component of the predominantly anisotropic etch process but depend only on the reliability of a well controllable selective growth-process.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Corresponding numerals in the different figures refer to corresponding parts and structures unless otherwise indicated. The figures are shown to clearly illustrate the relevant aspects of the preferred embodiments and are not necessarily in all respects drawn to scale.

Figure 1A:
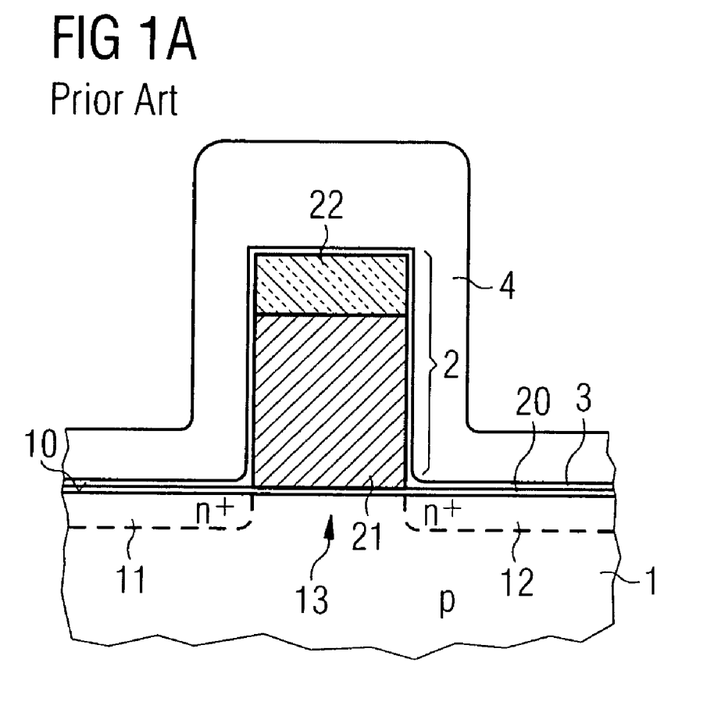
FIGS. 1A and 1B depict cross-sectional views of a semiconductor substrate with a vertical device and sidewall spacers that are formed by conventional methods.
Figure 1B:
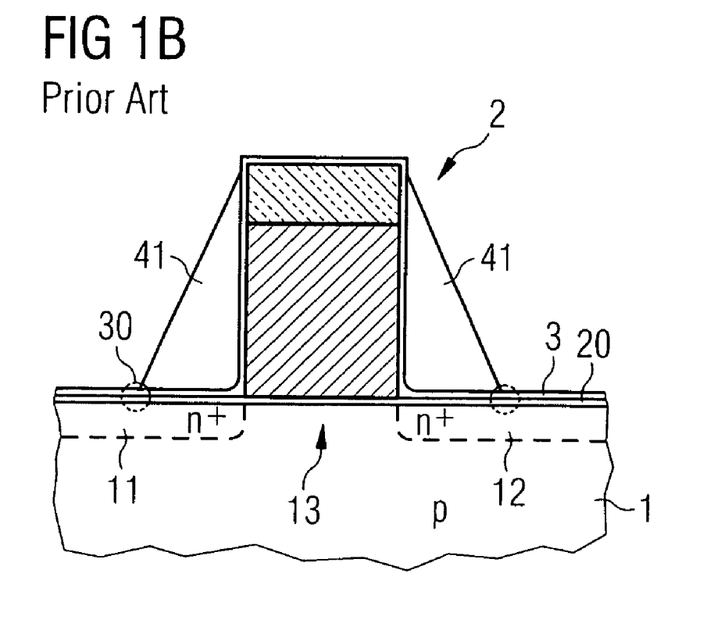

FIGS. 1A and 1B illustrate a conventional method of forming a vertical device 2 with a conventional sidewall spacer 41. On a substrate surface 10 of a monocrystalline semiconductor substrate 1 a dielectric liner 20 is formed. Semiconductor substrate 1 may be a silicon wafer. Dielectric liner 20 may be formed by thermal oxidation of the semiconductor substrate 1. Dielectric liner 20 may also be formed by deposition of a dielectric material such as silicon oxide, silicon nitride, aluminum oxide or another dielectric metal oxide or an oxide of rare earth. The thickness of dielectric liner 20 is about 2 to 20 nm. A vertical device 2 is disposed on dielectric liner 20. Vertical device 2 includes a bottom layer 21 that covers a section of dielectric liner 20. Bottom layer 21 may consist of doped polycrystalline silicon (polysilicon) and may have a thickness of about 50 to 150 nm. A top layer 22 covers bottom layer 21 and may consist of a dielectric material, such as silicon nitride. The height of vertical device 2 is about 200 nm. Vertical device 2 has essentially vertical sidewalls on opposing sides. The width of vertical device 2 between the two opposing vertical sidewalls is about 100 nm. Vertical device 2 may also include a high conductivity layer (not shown) between top layer 22 and bottom layer 21 and further barrier layers (not shown) below and/or above the high conductivity layer.

A conformal etch stop liner 3 covers dielectric liner 20 and vertical device 2 in a thickness of 2 to 20 nm and may consist of silicon nitride. Two source/drain regions 11, 12 are formed within substrate 1 as lightly doped implants. The edges of the source/drain regions 11, 12 are aligned to the vertical sidewalls of vertical device 2. In this embodiment, substrate 1 is p-conductive, whereas the lightly doped sections of source/drain regions 11, 12 are $n^+$-conductive. For other applications, substrate 1 may be n-conductive and source/drain regions 11, 12 may be $p^+$-conductive.

Vertical device 2 forms a gate electrode of a field effect transistor. A section of dielectric liner 20 that separates bottom layer 21 from substrate 1 forms a gate dielectric. An electrical potential of bottom layer 21 controls the charge carrier distribution within channel region 13 separating the two source/drain regions 11, 12. A conformal spacer liner 4 is deposited on etch stop liner 3. Conformal spacer liner 4 consists of a silicon dioxide and may be deposited by a chemical vapor deposition process. The thickness of conformal spacer liner 4 may be about 20 to 200 nm.

Then an anisotropic etch process is performed resulting in the structure that is shown in FIG. 1B. The anisotropic etch process removes the material of conformal spacer liner 4 in a top-bottom direction. Thereby conformal spacer liner 4 is removed from horizontal sections of etch stop liner 3. For ensuring reliable removal of conformal spacer liner 4 from all horizontal sections of etch stop liner 3, an over-etch of conformal spacer liner 4 is performed.

Due to an isotropic component of the mainly anisotropic etch, the outer sidewall of the resulting sidewall spacer 41 opposing the gate electrode is inclined to the substrate surface. Resulting sidewall spacer 41 has a triangular cross-section. The angle between the oblique outer sidewall of the resulting spacer structure 41 and the substrate surface 10 may be about 50 to 60 degrees. The width of sidewall spacer 41 near substrate surface 10 depends therefore largely from the height of the vertical device 2. Due to the over-etch, etch stop liner 3 and underlying sections of substrate 1 may be damaged. Defects in substrate 1 in defect prone regions 30 may then occur.

Figure 2A:
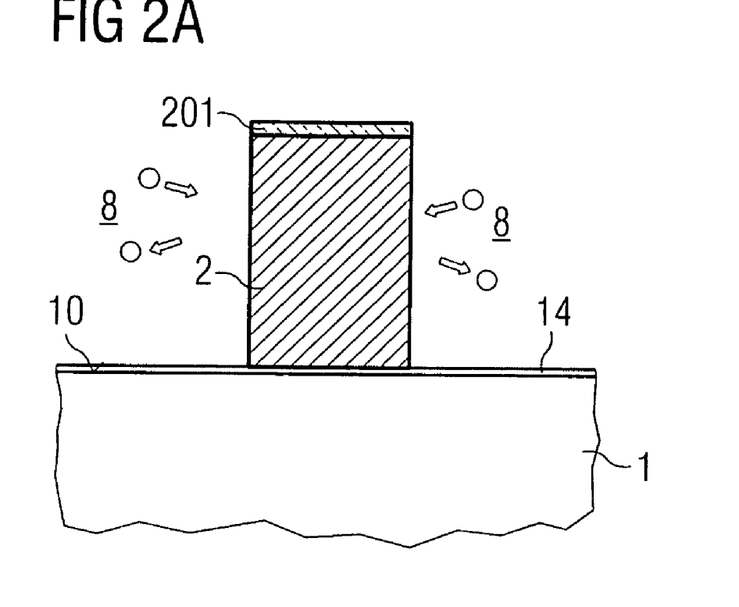
FIGS. 2A and 2B depict cross-sectional views of a semiconductor substrate and a vertical device and the formation of a sidewall spacer in accordance with a first embodiment of the invention.
Figure 2B:
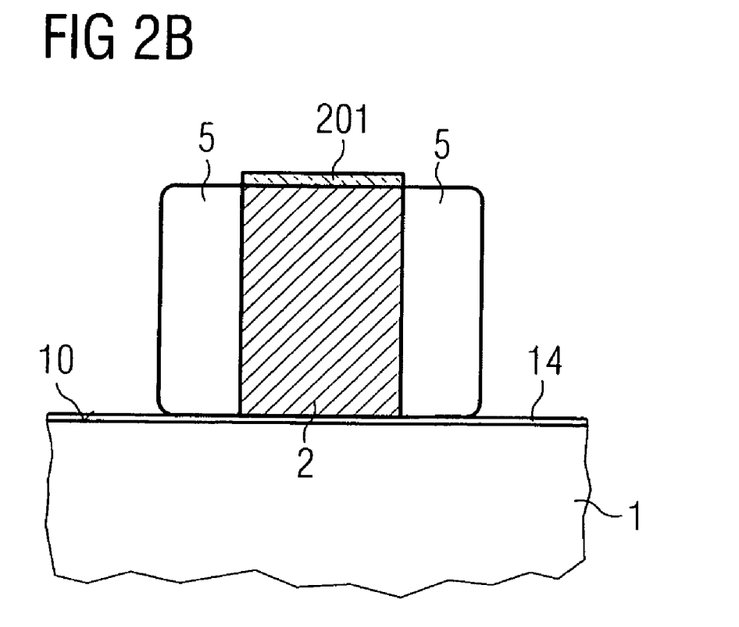

FIGS. 2A-2B illustrate an embodiment of the inventive method of forming a vertical device 2 with sidewall spacers 5. A substrate surface 10 of a semiconductor substrate 1 is covered by a liner, which forms a non-growth section 14. The material of non-growth section 14 may be silicon nitride. A vertical device 2 is disposed on non-growth section 14. Vertical device 2 includes essentially or substantially vertical sidewalls and consists of a seed material. The seed material forms a preferential site for adsorbing and/or decomposition of a gaseous precursor 8. A non-growth liner 201 covers a top surface of vertical device 2. Non-growth liner 201 and non-growth section 14 consist of passive materials respectively. The respective passive material has a low adsorption/sticking coefficient for a gaseous precursor 8 and/or does not facilitate or enhance a decomposition of the gaseous precursor 8, such that it may regarded as being essentially inert to gaseous precursor 8.

Referring to FIG. 2A, vertical device 2 is disposed on non-growth section 14 of semiconductor substrate 1. Non-growth liner 201 covers the horizontal upper surface of vertical device 2. The passive material may be silicon nitride. The seed material may be amorphous silicon (amorphous silicon) or polycrystalline silicon (polysilicon) if a silicon oxide, polysilicon or tungsten is the growth material.

If silicon oxide is selected as the growth material, tetraethylene orthosilane may be supplied as gaseous precursor 8 in an environment containing ozone and having a temperature of about 300 to 500 degree Celsius.

If polysilicon is selected as the growth material, $SiH_2Cl_2$ may be supplied as gaseous precursor 8 in an environment containing $H_2$ and HCl at a temperature of about 850 to 1050 degree Celsius and a flow rate ratio of HCl to $SiH_2Cl_2$ of at least 2:1.

If tungsten is selected as the growth material, $WF_6$ may be supplied as gaseous precursor 8 in an environment containing $SiH_4$ at a temperature of about 280 to 350 degree Celsius, a total gas pressure of 100 mTorr and a flow rate ratio of $SiH_4$ to $WF_6$ of less than 0.6. Alternatively, a $H_2$ carrier gas flow of about 1000 sccm may be considered.

The seed material of vertical device 2 may form a preferential site for adsorption and/or decomposition of gaseous precursor 8. From the gaseous precursor, a growth material is obtained that preferably deposits first on the interface to the seed material and then on the yet grown growth material. The passive materials forming non-growth liner 201 and non-growth section 14 are essentially inert to gaseous precursor 8. Therefore, the sidewall spacers 5 that emerge from gaseous precursor 8 grow selectively on the sidewalls of vertical device 2.

Referring to FIG. 2B, sidewall spacers 5 grow on the vertical sidewalls of vertical device 2 by adsorption/decomposition of gaseous precursor 8. Sidewall spacers 5 show good conformity and essentially or substantially uniform cross-sections over the full height of vertical device 2. As the process of selective growing of silicon dioxide on amorphous silicon or polysilicon can be controlled with high selectivity, nearly no silicon oxide grows on the silicon nitride of non-growth section 14 and non-growth liner 201.

The width of sidewall spacers 5 does not depend from the height of vertical device 2. As neither a conformal deposition nor an etch with an isotropic component is performed, non-growth section 14 shows no defect prone sections corresponding to defect prone sections 30 of FIG. 1B.

Figure 3A:
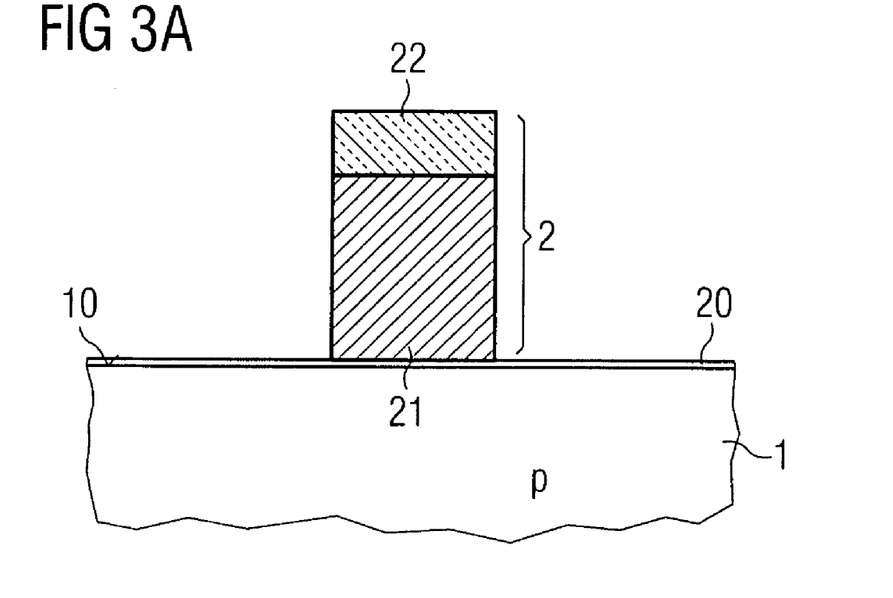
FIGS. 3A-3G depict cross-sectional views of a semiconductor substrate and a vertical device and the formation of a field effect transistor in accordance with a second embodiment of the invention.

FIGS. 3A-3G illustrate a method of forming a field effect transistor. Referring to FIG. 3A, a p-doped single crystalline silicon substrate 1 with a horizontal substrate surface 10 is provided. A dielectric liner 20 is formed on substrate surface 10. The thickness of dielectric liner 20 is between 2 and 20 nm. A gate electrode comprising a bottom layer 21 and a top layer 22 is formed as a vertical device 2 on dielectric liner 20. Bottom layer 21 consists of polysilicon. Top layer 22 covering the bottom layer 21 may consist of silicon nitride. Gate electrode 2 includes two opposing vertical sidewalls. The width of gate electrode 2 between the two opposing vertical sidewalls is about 40 to 400 nm. The height of gate electrode 2 may be about 200 nm.

Figure 3B:
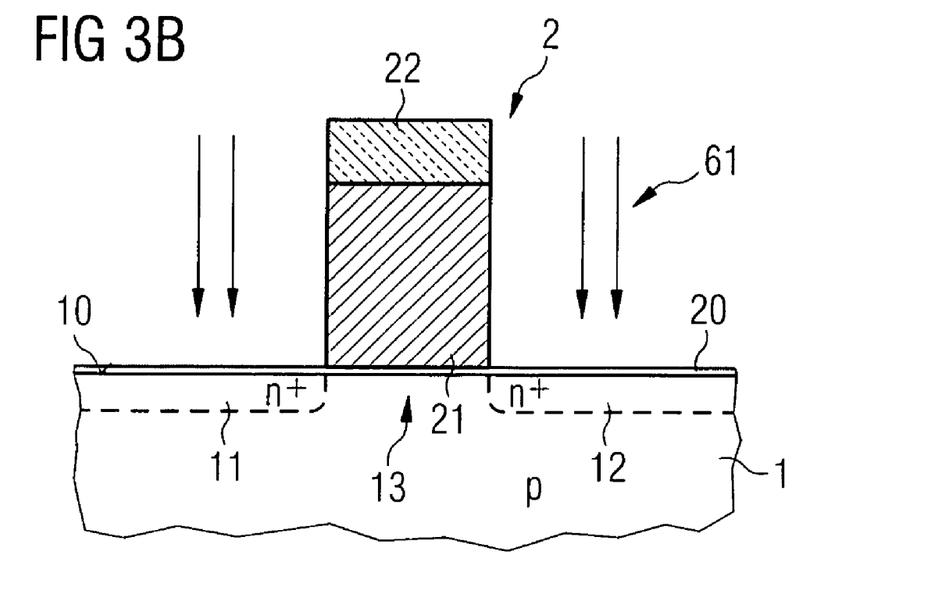

Referring to FIG. 3B, a LDD-implant 61 is performed, wherein lightly $n^+$-doped source/drain regions are formed within substrate 1 adjacent the gate electrode 2. Gate electrode 2 masks LDD-implant 61, wherein a section within substrate 1 shadowed by gate electrode 2 remains undoped by the LDD-implant. The undoped section forms a channel region 13 of the field effect transistor and separates the two source/drain regions 11, 12.

Figure 3C:
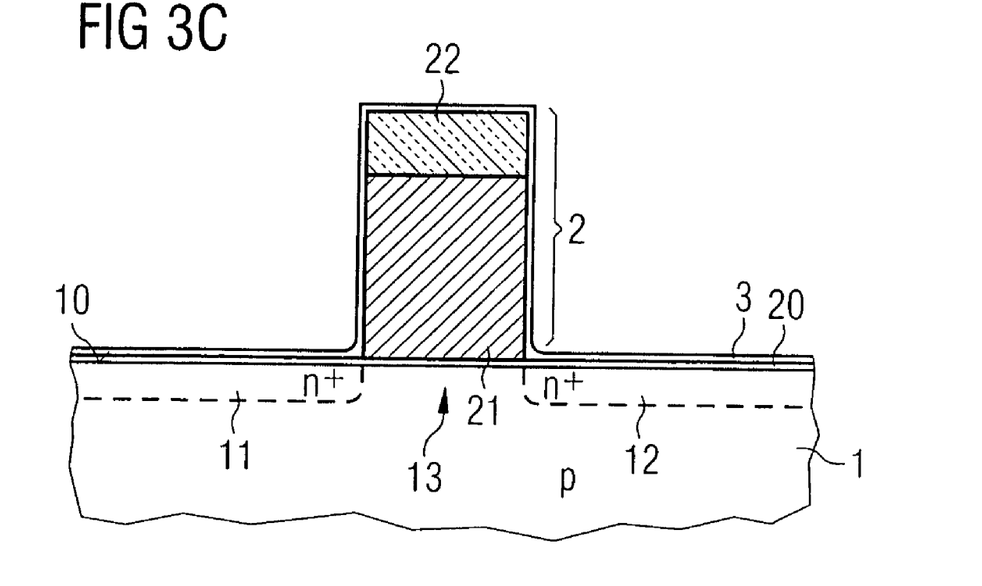

Referring to FIG. 3C, a thin etch stop liner 3 is deposited by a chemical or physical vapor deposition process or by atomic layer deposition. Etch stop liner 3 consists of a non-growth material that may be silicon nitride. FIG. 3C shows etch stop liner 3 covering dielectric liner 20 and gate electrode 2 and having a thickness of about 5 nm.

Figure 3D:
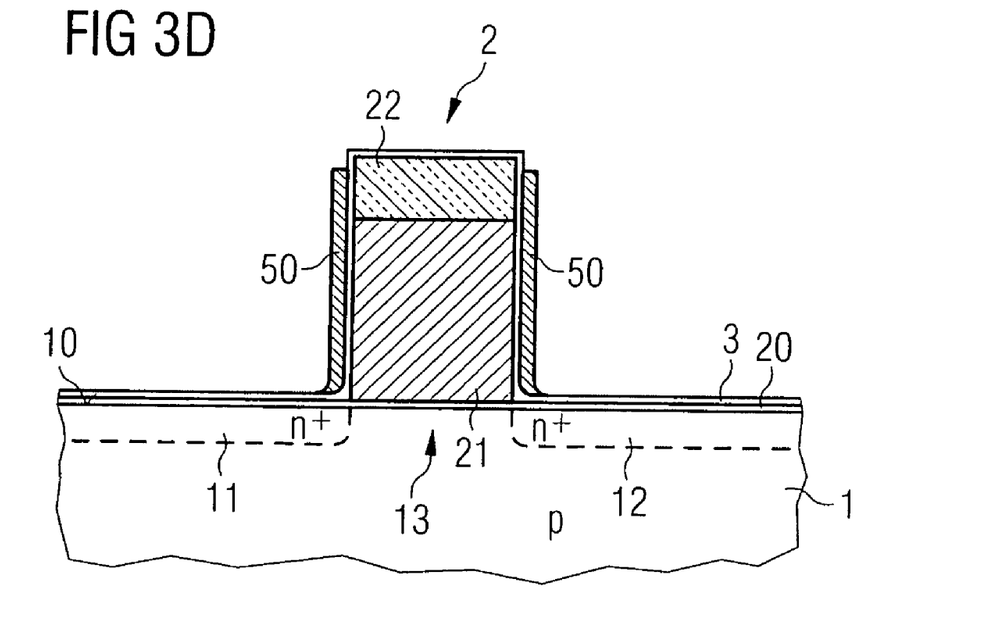

Referring to FIG. 3D, a conformal seed liner is deposited by a chemical or physical vapor deposition or by atomic layer deposition. The seed liner may consist of amorphous silicon or polysilicon. The thickness of the seed liner is about 5 to 20 nm. Deposition of the seed liner may comprise supplying $SiH_4$ in an environment containing $H_2$ at a temperature of about 500 to 650 degree Celsius and a pressure of about 600 mTorr.

Then a spacer etch is performed. The horizontal sections of the conformal seed liner covering dielectric liner 20 and the horizontal section of etch stop liner 3 on top of gate electrode 2 are removed. The residual portions of the conformal seed liner form a seed liner 50 covering the vertical sidewalls of gate electrode 2. Seed liner 50 may be pre-baked in an environment containing $H_2$ at a temperature of about 900 degree Celsius for 10 to 30 minutes in order to remove any surface oxide.

FIG. 3D shows seed liner 50, forming spacer-like structures that elongate along the vertical sidewalls of gate electrode 2. As amorphous silicon and polysilicon may be etched with high selectivity against the material of etch stop liner 3 and as the thickness of conformal seed liner 50 is comparatively small, no etch damages occur on horizontal sections of etch stop liner 3 covering dielectric liner 20.

Figure 3E:
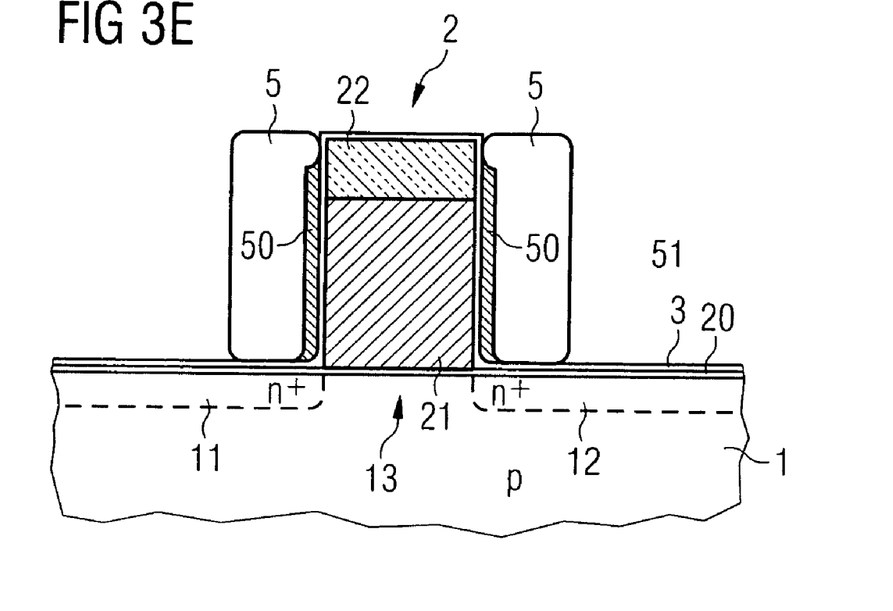

Referring now to FIG. 3E, tetraethylene orthosilane is applied in an environment containing ozone. A selective oxide growth of silicon dioxide on the amorphous silicon or polysilicon of seed liner 50 is controlled. As amorphous silicon and polysilicon form a preferential site for adsorbing/decomposing tetraethylene orthosilane respectively, the tetraethylene orthosilane is converted to silicon dioxide that grows starting from the interface to seed liner 50.

FIG. 3E shows sidewall spacers 5 grown from tetraethylene orthosilane in an environment containing ozone on seed liner 50. The silicon oxide grows with high selectivity exclusively on sidewall liner 50. The thickness of the sidewall spacers 5 is controlled by the amount of tetraethylene orthosilane that is applied. The thickness of sidewall spacers 5 may amount up to 200 nm referring to a height of gate electrode 2 of about 200 nm.

A parasitic siliconoxide resulting from a parasitic growth on other surfaces, for example on the etch stop liner 3, may be removed by a short BHF pullback.

Figure 3F:
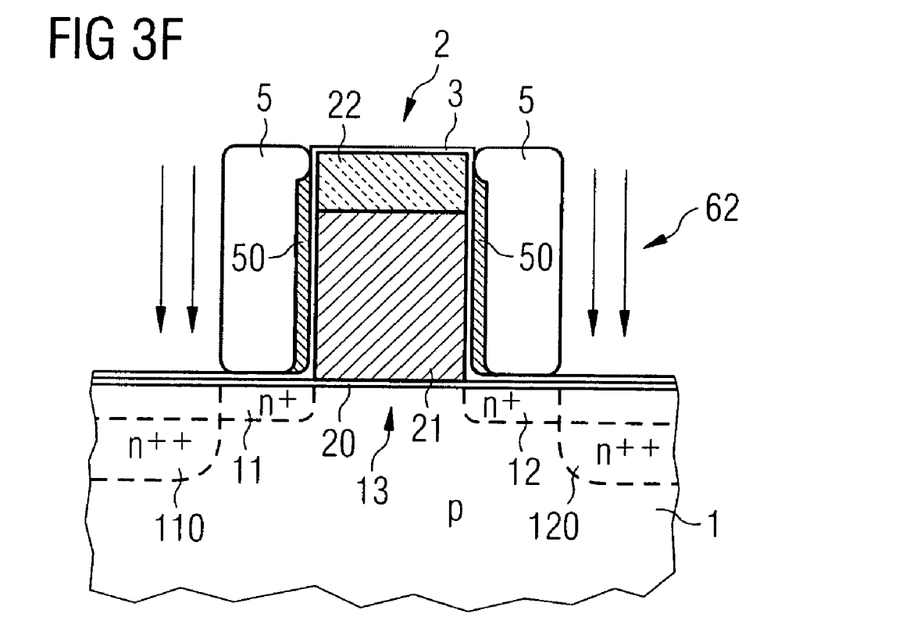

Referring to FIG. 3F, a HDD-implant 62 may be performed, wherein sidewall spacers 5 and gate electrode 2 act as a further implant mask and shield the underlying sections of source/drain regions 11, 12 and the channel region 13 from the heavy dose of HDD-implant 62. FIG. 3F shows the heavily doped contact regions 110, 120 overlapping lightly doped source/drain regions 11, 12.

Due to the nearly vertical sidewalls of sidewall spacers 5, the edges of heavily doped contact regions 110, 120 are well defined with respect to gate electrode 2. The distance between gate electrode 2 and the heavily doped contact regions 110, 120 is well controlled. The distance may also be in the same order of magnitude as the height of gate electrode 2. Sidewall spacer 5 may be removed by a wet etch process using BHF. Seed liner 50 may be removed by a wet etch process using $NH_4OH$ or a mixture of $HNO_3$ and HF in a ratio of 5:1 at room temperature. Etch stop liner 3 may be removed by a wet etch process using $H_3PO_4$.

Figure 3G:
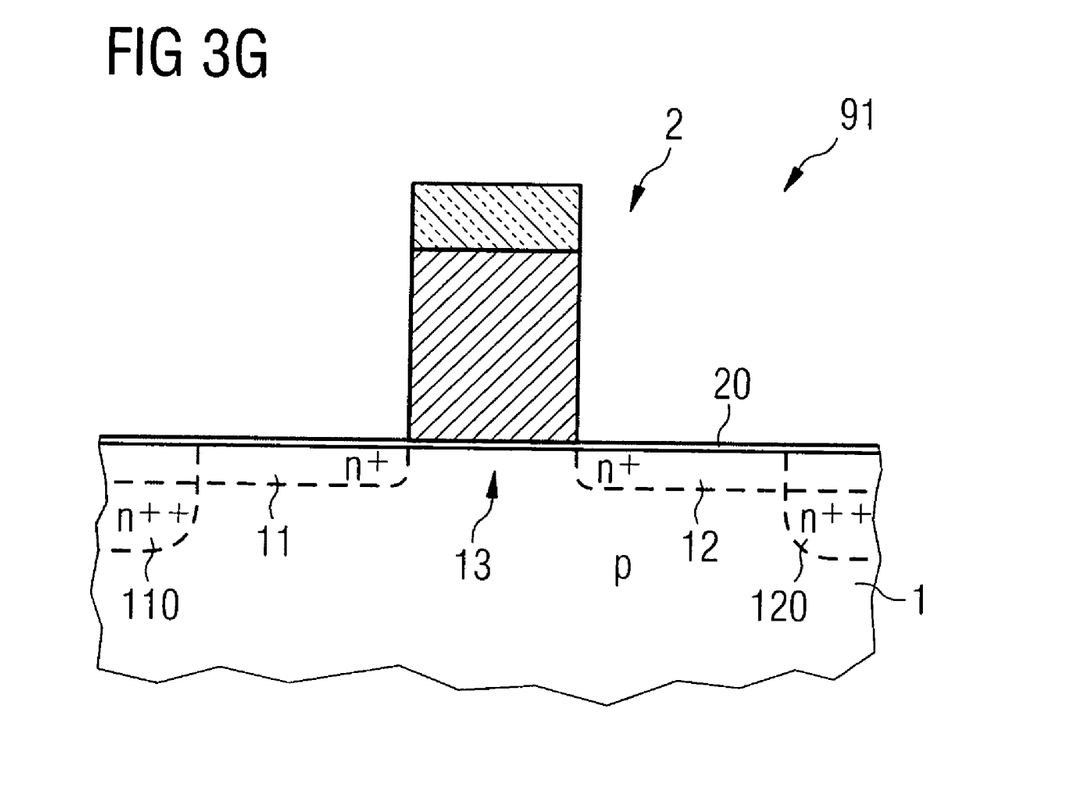

FIG. 3G shows a field effect transistor 91 with a gate electrode 2 controlling the charge carrier distribution in channel region 13. Channel region 3 separates two low-doped source/drain regions 11, 12. Heavily doped contact regions 110, 120 overlap the respective source/drain region 11, 12 and are spaced apart from gate electrode 2. A section of dielectric liner 20 between gate electrode 2 and channel region 13 forms a gate dielectric of field effect transistor 91.

Figure 4A:
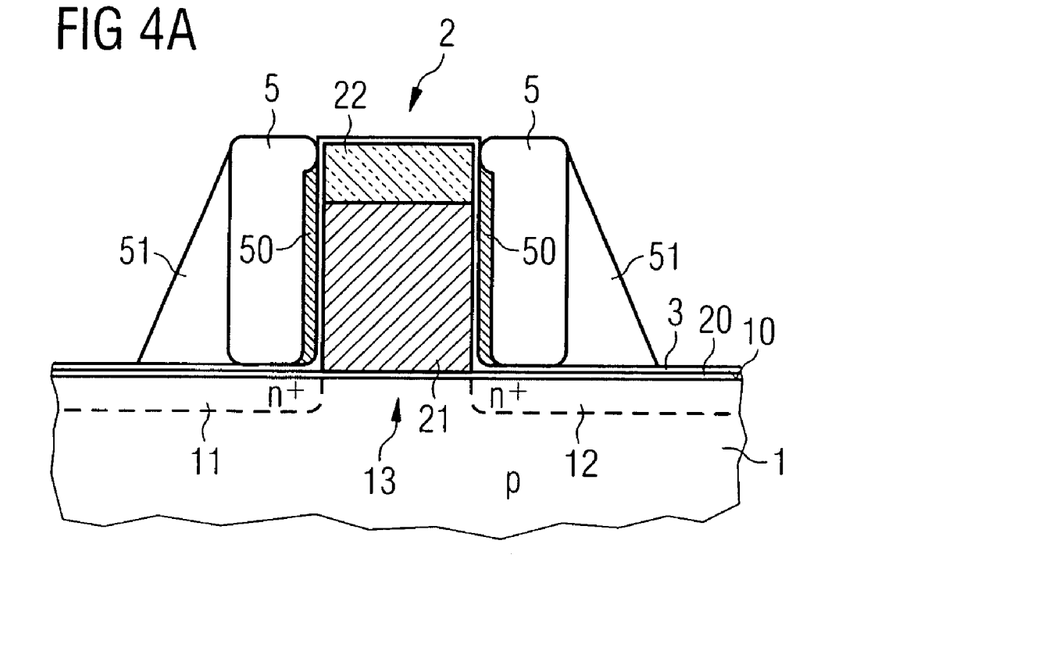
FIG. 4A-FIG. 4B depict cross-sectional views of a semiconductor substrate with a vertical device and sidewall spacers and the formation of a field effect transistor in accordance with a further embodiment of the invention.
Figure 4B:
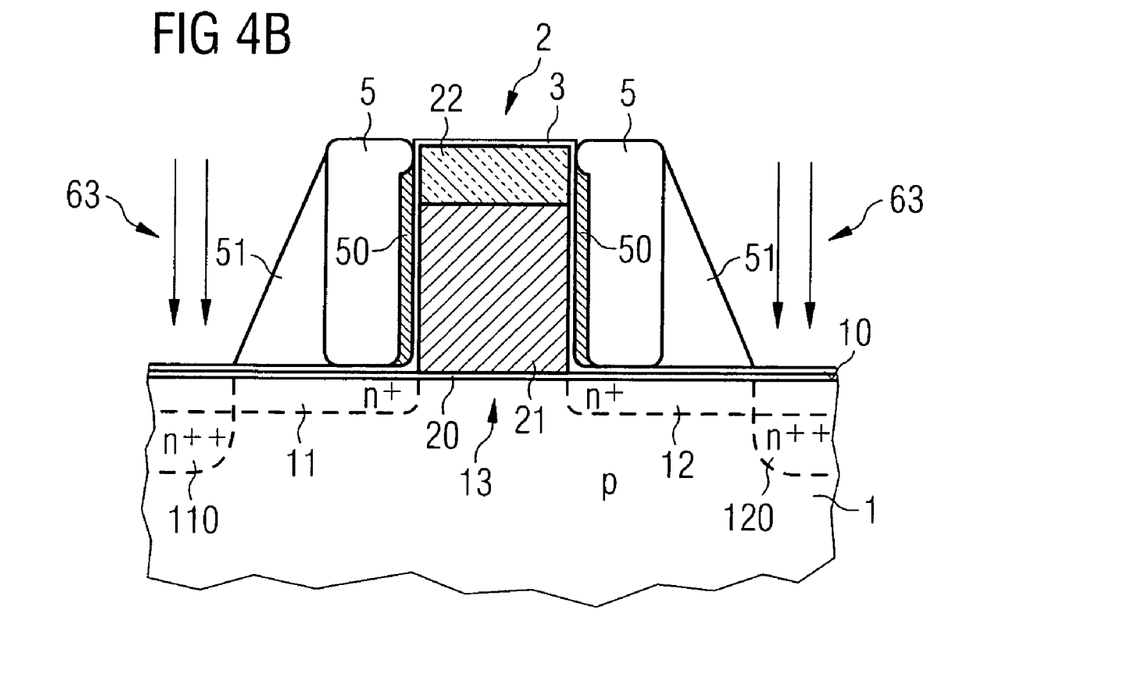

FIGS. 4A-4B illustrate a method for further increasing the distance between heavily doped contact regions 110, 120 to gate electrode 2. Referring to FIG. 4A, subsequent to the process shown in FIG. 3E, a conventional spacer formation may be performed after the formation of sidewall spacers 5 by selective oxide growth. A conformal liner of silicon oxide or silicon nitride is deposited on etch stop liner 3, gate electrode 2 and sidewall spacers 5. An anisotropic etch is performed, wherein horizontal sections of the deposited additional conformal spacer liner are removed. A conventional sidewall spacer 51 is formed thereby along the vertical outer sidewalls of sidewall spacer 5.

Referring to FIG. 4B, subsequent to the formation of the additional conventional sidewall spacer 51, a HDD-implant 63 is performed. The distance between the heavily doped contact regions 110, 120 emerging from the HDD-implant 63 to gate electrode 2 is determined by both the width of sidewall spacer 5 being grown by selective oxide growth and by the width of additional conventional sidewall spacer 51. As the width of selective grown sidewall spacer 5 may be limited, this embodiment makes feasible even larger distances between the heavily doped contact regions 110, 120 to gate electrode 2.

Figure 5:
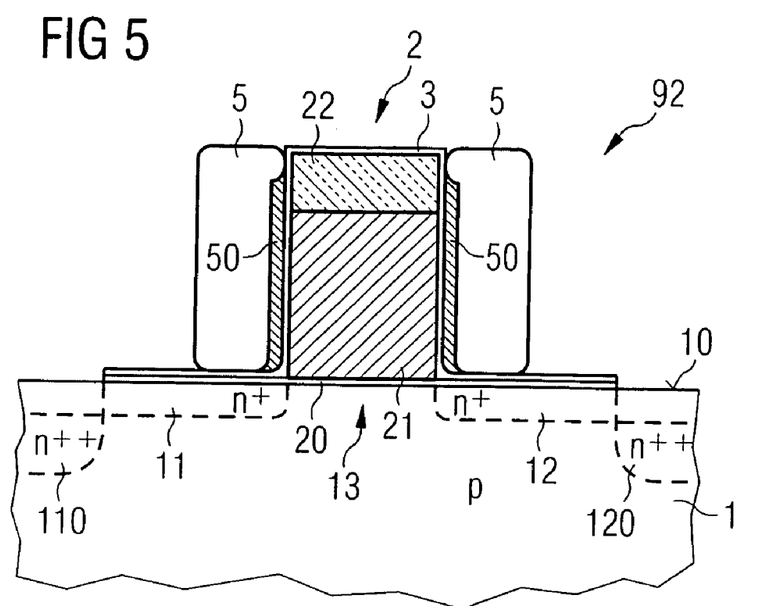
FIG. 5 depicts a cross-sectional view of a field effect transistor according to another embodiment of the invention.

FIG. 5 shows a field effect transistor 92 resulting from the described method of forming a field effect transistor. Within a p-doped single crystalline silicon substrate 1 two lightly $n^+$-doped source/drain regions 11, 12 are formed. A p-doped channel region 13 separates the lightly $n^+$-doped source/drain regions 11, 12. A dielectric liner 20 covers a section of a horizontal substrate surface 10 of substrate 1. Source/drain regions 11, 12 and channel region 13 adjoin substrate surface 10. A gate electrode 2 comprising a bottom layer 21 and a top layer 22 is disposed on gate dielectric liner 20 above channel region 13. A section of dielectric liner 20 between gate electrode 2 and channel region 13 forms a gate dielectric of FET 92. A residual portion of an etch stop liner 3 covers gate electrode 2. Sidewall spacer like seed liner 50 is provided on opposing vertical sidewalls of gate electrode 2. Sidewall spacers 50 having uniform thickness separate gate electrode 2 from heavily $n^{++}$-doped contact sections 110, 120 that are formed within substrate 1 and that overlap respective source/drain regions 11, 12.

Figure 6:
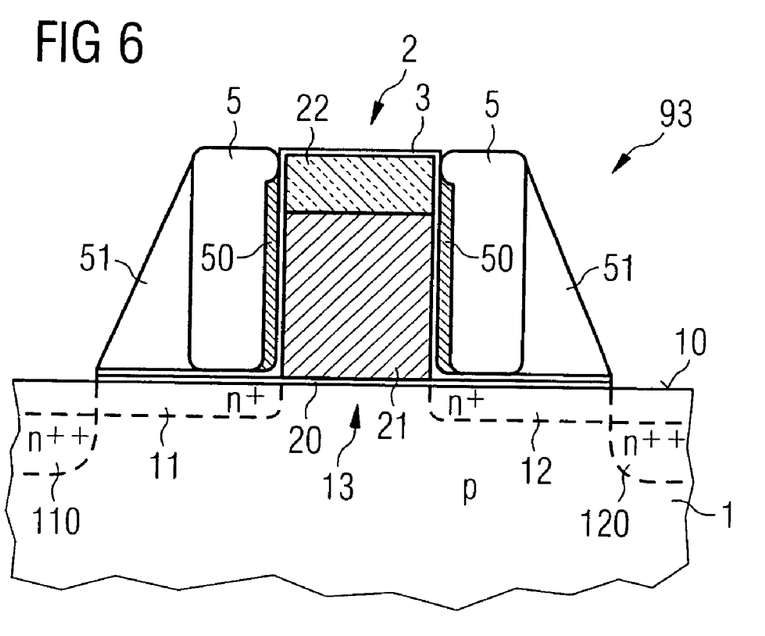
FIG. 6 depicts a cross-sectional view of another field effect transistor with double spacer structure according to a further embodiment of the invention.

The FET 93 that is illustrated in FIG. 6 differs from FET 92 as illustrated in FIG. 5 in additional, conventional sidewall spacers 51 being formed along outer vertical sidewalls of selectively grown sidewall spacers 5. Consequently, heavily $n^{++}$-doped contact regions 110, 120 are separated from gate electrode 2 by both selective grown sidewall spacers 5 and conventionally formed sidewall spacers 51, making feasible higher voltage differences between contact structures 110, 120 and gate electrode 2. FET 92 and FET 93 may therefore be DMOS devices by way of example.

Figure 7:
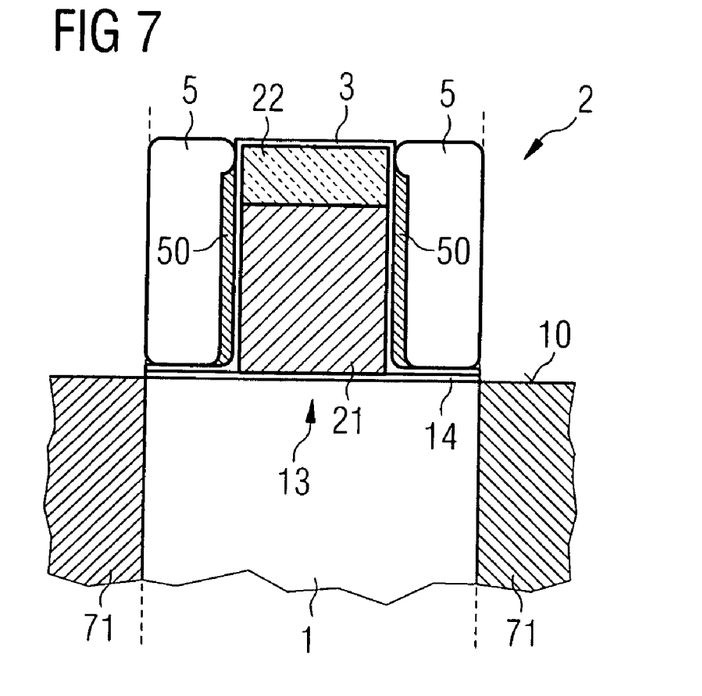
FIG. 7 depicts a cross-sectional view of a semiconductor substrate with a buried secondary device aligned to a vertical device via an aligning method according to another embodiment of the invention.

FIG. 7 illustrates a method of aligning a secondary structure 71 to a primary, vertical device 2. Vertical device 2 with spacer-like seed liner 50 and selective grown sidewall spacer 5 is provided according to the formation of vertical device 2 with sidewall spacers 5 of FIG. 3E. A trench etch is performed. During the trench etch, selective grown sidewall spacers 5 and vertical device 2 act as an etch mask. Then buried secondary structures 71 are formed by filling the etched trenches. Buried secondary structures 71 are aligned to the outer vertical sidewalls of selective grown sidewall spacers 5. The distance between secondary structures 71 and vertical device 2 is defined by the thickness of selective grown sidewall spacer 5. The distance is independent from the conformity of a proceeding deposition process and the degree of anisotropy of an etch process. The distance is further independent from the height of vertical device 2.

Figure 8:
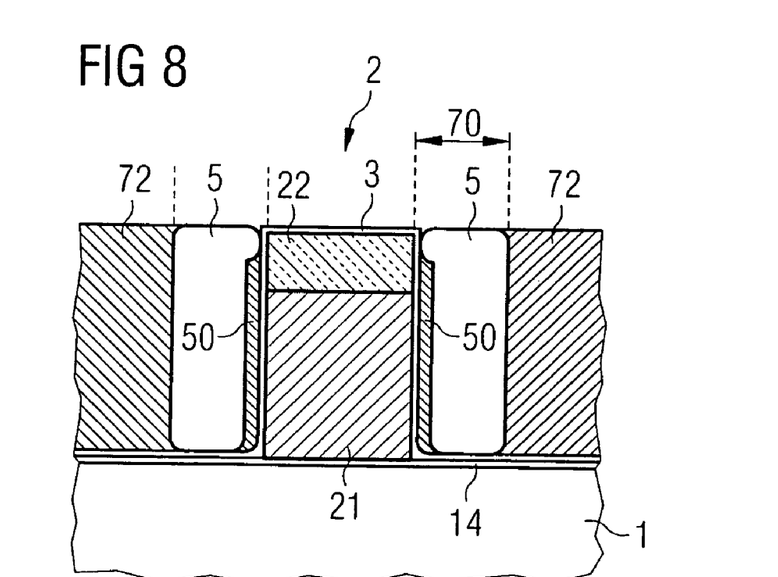
FIG. 8 depicts a cross-sectional view of a semiconductor substrate with a secondary device aligned to a first vertical device via an alignment method according to yet another embodiment of the invention.

FIG. 8 shows a further method of aligning a secondary structure to a vertical device 2. A spaced secondary structure 72 is formed by deposition of a secondary material on selective grown sidewall spacers 5, vertical device 2 and substrate 1. A distance 70 between the vertical sidewall of vertical device 2 and the vertical sidewall of spaced secondary structure 72 is defined independent from the height of vertical device 2 and of photolithographic overlay tolerances.

In all above described embodiments, selective grown sidewall spacer 5 may be removed after aligning secondary structures 110, 120, 71, 72 to vertical device 2. For example, selective grown sidewall spacer 5 may be replaced by another insulator material with better insulating properties or with a lower thickness or a more suitable k-value. In all applications that provide removal of the selective grown sidewall spacer 5, an etch stop liner 3, for example of silicon nitride, may be deposited on vertical device 2 and substrate 1 before forming spacer-like seed liner 50. In applications with non-temporary selective grown sidewall spacers 5 etch stop liner 3 may be omitted.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method of manufacturing an integrated circuit, the method comprising:
   providing a semiconductor substrate, wherein the semiconductor substrate comprises a first section including a first material, wherein the first material adjoins a horizontal substrate surface of the semiconductor substrate;
   providing a first structure on the horizontal substrate surface of the semiconductor substrate, the first structure including at least one vertical sidewall adjoining the first section of the substrate surface, wherein the first structure comprises a second section that includes a second material, at least part of the first section is not covered by the first structure, and the second material is exposed at the at least one vertical sidewall; and providing a sidewall spacer, wherein the sidewall spacer is elongated along the at least one vertical sidewall of the first structure and is formed of a third material resulting from a gaseous precursor, the first and second materials and the gaseous precursor being selected such that the third material is selectively grown on the second material;

wherein the providing of the first structure comprises:
providing an inner section of the first structure on the semiconductor substrate, the first structure including at least one vertical sidewall; and
providing a seed liner on the at least one vertical sidewall of the inner section, wherein the seed liner forms the second section.

2. The method of claim 1, wherein providing the seed liner comprises:
depositing a conformal liner of the second material in a thickness of 5 to 40 nm; and
anisotropically etching the conformal liner of the second material, wherein residual portions of the conformal liner of the second material form the seed liner.

3. The method of claim 2, wherein depositing the conformal liner comprises supplying $SiH_4$ in an environment containing $H_2$ at a temperature of about 500° C. to about 650° C. and a pressure of about 600 mTorr.

4. The method of claim 1, wherein the second material includes one of amorphous silicon and polycrystalline silicon, the gaseous precursor consists of tetraethylene orthosilane, and the tetraethylene orthosilane is supplied in an environment containing ozone at a temperature between 300° C. and 500° C. such that silicon oxide grows selectively on the second section.

5. The method of claim 1, wherein the second material includes one of amorphous silicon and polycrystalline silicon, the gaseous precursor consists of $SiH_2Cl_2$, and a mixture of $SiH_2Cl_2$, HCl and $H_2$ is supplied at a temperature of about 850° C. to about 1050° C. and a flow rate ratio of HCl to $SiH_2Cl_2$ of at least 2:1 such that polysilicon grows selectively on the second section.

6. The method of claim 1, wherein the second material includes one of amorphous silicon and polycrystalline silicon, the gaseous precursor consists of $WF_6$, and $WF_6$ and $SiH_4$ are supplied at a temperature of about 280° C. to about 350° C., a total gas pressure of 100 mTorr and a flow rate ratio of $SiH_4$ to $WF_6$ of 0.6 or less such that tungsten grows selectively on the second section.

7. The method of claim 1, wherein the integrated circuit comprises a field effect transistor, the field effect transistor being at least partially defined by portions of the semiconductor substrate and comprising a dielectric liner defined by at least a portion of the first section and a gate electrode formed on at least a portion of the dielectric liner and providing the at least one vertical sidewall of the first structure such that the second material is provided on at least one portion of the gate electrode, and the third material forming the sidewall spacer is selectively grown over the at least one portion of the gate electrode including the second material.

8. The method of claim 1, further comprising:
providing a secondary structure adjacent the sidewall spacer such that the secondary structure is aligned with the first structure.

9. The method of claim 8, wherein the secondary structure includes a further structure that is formed by deposition of a deposition material on the substrate surface and the sidewall spacer.

10. The method of claim 8, wherein the secondary structure includes a doped region within the semiconductor substrate, the doped region being formed by implantation of a doping material into an implant section of the semiconductor substrate, and the sidewall spacer serves as an implant mask.

11. The method of claim 8, wherein the secondary structure includes a buried secondary device being formed by etching a trench into the semiconductor substrate, and the sidewall spacer provides an etch mask for etching the trench.

12. The method of claim 1, wherein the sidewall spacer has a uniform thickness along a length of the sidewall spacer.

* * * * *